United States Patent
Tatsuta et al.

(10) Patent No.: US 6,956,879 B2
(45) Date of Patent: Oct. 18, 2005

(54) SEMICONDUCTOR LASER DEVICE, OPTICAL PICKUP USING THE SAME, AND APPARATUS AND METHOD FOR MANUFACTURING THE SAME

(75) Inventors: Hideaki Tatsuta, Kitakatsuragi-gun (JP); Hiroshi Chikugawa, Kashihara (JP); Takaaki Horio, Osaka (JP); Shinji Yudate, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 236 days.

(21) Appl. No.: 10/290,294

(22) Filed: Nov. 8, 2002

(65) Prior Publication Data

US 2003/0091075 A1 May 15, 2003

(30) Foreign Application Priority Data

Nov. 9, 2001 (JP) ........................................ 2001-344636

(51) Int. Cl.[7] .............................................. H01S 3/04
(52) U.S. Cl. ............................. 372/36; 372/107; 372/24
(58) Field of Search .................................. 372/36, 107

(56) References Cited

U.S. PATENT DOCUMENTS 6,208,419 B1 * 3/2001 Yamamoto et al. ......... 356/400
6,440,758 B1 * 8/2002 Tamaishi et al. ............... 438/7
2003/0054581 A1 * 3/2003 Ozawa et al. ................. 438/25

FOREIGN PATENT DOCUMENTS

| JP | 3027674 B | 3/1995 |
| JP | 2002-83827 | 3/2002 |

* cited by examiner

Primary Examiner—Don Wong
Assistant Examiner—Dung T Nguyen
(74) Attorney, Agent, or Firm—Morrison & Foerster LLP

(57) ABSTRACT

The present invention relates to an optical pickup used for an optical recording information instrument such as CD-ROM, CD-R, MO, DVD and the like, and a semiconductor laser device assembled to be incorporated in the optical pickup, as well as to a method for manufacturing said semiconductor laser device. The present invention also relates to a semiconductor laser element comprising a plurality of semiconductor laser chips, which is incorporated in the semiconductor laser device and to a method for manufacturing said semiconductor laser element, especially to an apparatus for accurately bonding and assembling a semiconductor laser element used in manufacturing said semiconductor laser element, such as a semiconductor laser chip die-bonding machine and the like.

23 Claims, 12 Drawing Sheets

SEMICONDUCTOR LASER DEVICE, OPTICAL PICKUP USING THE SAME, AND APPARATUS AND METHOD FOR MANUFACTURING THE SAME

FIELD OF THE INVENTION

The present invention relates to an optical pickup used for an optical recording information instrument such as CD-ROM, CD-R, MO, DVD and the like, and a semiconductor laser device assembled to be incorporated in the optical pickup, as well as to a method for manufacturing said semiconductor laser device.

BACKGROUND OF THE INVENTION

A drive unit of an information instrument uses an optical pickup for using in CD, CD-R, DVD and the like, in which a semiconductor laser device having an optimum laser emission wavelength and an optimum luminous energy depending on a recording medium to be used is incorporated.

In general, an optical pickup comprises a semiconductor laser device having an incorporated semiconductor laser element, in which one semiconductor laser chip (hereinafter referred to as "LD chip") is die-bonded on one sub-mount so that an axis of a light emitted from the LD chip directs in a predetermined direction relative to the sub-mount. In addition, there is an optical pickup comprising a plurality of optical sources each having the same wavelength and optical output in order to enhance a speed of the pickup.

Further, there is a semiconductor laser device incorporating a semiconductor laser element formed by die-bonding one LD chip emitting lights with different wavelengths on one sub-mount. However, in this case, an angle difference between axes of the lights from two optical sources is unchanged by changing die-bonding conditions.

Since an optimum laser emission wavelength and an optimum laser emission intensity depend on a recording medium to be used, when it is required to use different recording media in one information instrument, for example, two optical pickups are incorporated in a drive unit of the information instrument, or two semiconductor laser devices are incorporated in one optical pickup, resulting in making an optical system complicated and in enlarging the whole information instrument.

In addition, even when the semiconductor laser device comprises a semiconductor laser element having an LD chip emitting lights with different wavelengths, a large difference in an optical output between recording to and reading from a recording medium is required. It is difficult to fabricate a plurality of optical sources, whose laser wavelengths and optical outputs differ greatly from each other, within one LD chip.

According to the present invention, an optical pickup having a plurality of optical sources whose emission wavelengths and optical outputs differ from each other can be easily produced by using a semiconductor laser device having a semiconductor laser element capable of emitting a plurality of lights with different wavelengths incorporated therein, said semiconductor laser element being formed by die-bonding on one sub-mount a plurality of LD chips having emission wavelengths and optical outputs suitable for different recording media.

FIG. 1 shows a schematic perspective view of a semiconductor laser element 1 in which on a sub-mount 101, one red LD chip 102 and one infrared LD chip 103 are mounted, as an example of a semiconductor laser element formed by die-bonding the plurality of LD chips described above on one sub-mount. In addition, FIG. 2 shows a schematic perspective view of an optical pickup 2, which is produced by using a semiconductor laser device 21 having the above semiconductor laser element 1 incorporated therein. The semiconductor laser device 21 comprises mainly a stem 201 and a lead wire 202, and the semiconductor laser element 1 is incorporated in a tip of the stem 201.

In the optical pickup 2 having the above features, as shown in FIG. 3, it is desired that both an emitted light axis 106 of the red LD chip 102 and an emitted light axis 107 of the infrared LD chip 103 are in an acceptable prescribed angular range (108 and 109) relative to a predetermined reference axis 203. The predetermined reference axis 203 is provided at a prescribed angle relative to a stem reference surface 204. Preferably, the predetermined reference axis 203 is provided at a right angle relative to the stem reference surface 204.

It is necessary that light emitted from each LD chip is focused on an optical disc 23 in order to read data recorded in the optical disc 23 accurately. For that reason, a lens 22 is moved towards directions indicated by a double-head arrow in FIG. 2 so that an emitted light axis of an LD chip to be used among the plurality of LD chips passes through the center of the lens 22. However, when the emitted light axis is far away from a straight line connecting the semiconductor laser device and a region to be read on the optical disc, it becomes impossible to read data accurately. Therefore, when any one of the axes of the lights emitted from the plurality of LD chips falls outside a prescribed angular range, such an optical pickup is regarded as a defective product.

Accordingly, in order to produce high-precise optical pickups at a high yield, axes of lights emitted from a plurality of LD chips are required to stay in prescribed angular ranges. For that reason, it is firstly required that, in forming a semiconductor laser element, a plurality of LD chips are die-bonded accurately on a sub-mount and, more specifically, these LD chips are die-bonded after their positions are corrected to make their emitted light axes generally parallel each other. Further, it is required that, in manufacturing a semiconductor laser device, the semiconductor laser element accurately formed is mounted on the stem so that the emitted light axes stay in the prescribed angular ranges.

The following description discusses the conventional method and apparatus for manufacturing a semiconductor laser device by die-bonding a plurality of LD chips on one sub-mount to form a semiconductor laser element, and die-bonding said semiconductor laser element on a stem.

A. Constitution of an Apparatus for Manufacturing a Semiconductor Laser Device

The conventional apparatus for manufacturing a semiconductor laser device is described by referring to FIG. 4.

The conventional apparatus for manufacturing a semiconductor laser device 4 comprises an element sheet part 401, an intermediate stage part 402, an emitted light axis recognizing part 403, a die-bonding part 404, a contacting part 405, a transferring movable part 406, shape-recognizing cameras (407 and 408) and others.

The element sheet part 401 is a part for supplying a semiconductor laser element 1 in which one or more LD chips are die-bonded on one sub-mount in a previous process.

The intermediate stage part 402 is a part for correcting a position of the supplied semiconductor laser element 1 by shape-recognition or the like.

The emitted light axis recognizing part 403 is a part for recognizing an emission point, an emitted light axis and the like, and has only an Y-axis actuator as a mechanism for capturing the emission point and the emitted light axis.

The die-bonding part 404 is a part for die-bonding the semiconductor laser element, a position of which has been corrected, on a stem 201 of a semiconductor laser device 21.

The contacting part 405 has one contact probe pair, which is provided separately outside the transferring movable part 406, and has a YZ-axis actuator as a mechanism for making a contact.

The transferring movable part 406 has two collet parts (409 and 410) and, each has a Z-axis actuator as a mechanism for moving the collet part up and down.

B. A Method for Manufacturing a Semiconductor Laser Device

Next, the conventional method for manufacturing a semiconductor laser device will be explained below.

(1) A semiconductor laser element set in the element sheet part 401 is position-corrected by shape-recognizing with a camera 407 provided above the element sheet part 401.

(2) The transferring movable part 406 is moved right, and the collet part 409 is moved up and down above the element sheet part 401 to take up the semiconductor laser element 1, a position of which has been corrected by shape-recognizing.

(3) The transferring movable part 406 is moved left, and the collet part 409 is moved up and down above the intermediate stage part 402 to set the semiconductor laser element 1 taken up, on the intermediate stage part 402.

(4) The transferring movable part 406 is moved to awaiting position, and the part 406 is halted to shape-recognize the semiconductor laser element 1 set on the intermediate stage part 402 with the camera 408 provided above the intermediate stage part 402.

(5) During shape-recognizing the above semiconductor laser element set on the intermediate stage part 402, as in the step (1), a next semiconductor laser element 1' set in the element sheet part 401 is shape-recognized with the camera 407 provided above the element sheet part 401.

(6) The contacting part 405 is moved to above the intermediate stage part 402 and moved down so as to contact with the semiconductor laser element 1 in order to recognize the emission point and the emitted light axis of the above semiconductor laser element 1 set on the intermediate stage part 402, which has been shape-recognized, wherein the emitted light axis is recognized only for one predetermined LD chip with the emitted light axis recognition camera 403.

(7) The contacting part 405 is moved up, the part 405 is moved out of an area above the intermediate stage part 402, the transferring movable part 406 is moved right, and the collet part 410 is moved up and down to take up the semiconductor laser element 1 on the intermediate stage part 402, for which the emission point and the emitted light axis have been recognized.

(8) During taking up the semiconductor laser element 1 on the intermediate stage part 402 as described above, as in the step (2), the collet part 409 is moved up and down above the element sheet part 401 to take up the semiconductor laser element 1'.

(9) The transferring movable part 406 is moved left and, thereafter, the collet part 410 is moved up and down above the die-bonding part 404 to die-bond the semiconductor laser element 1 taken up from the intermediate stage part 402, on the stem 201.

(10) During die-bonding the semiconductor laser element taken up from the intermediate stage part 402, on the stem 201, as in the step (3), the semiconductor laser element 1' taken up from the element sheet part 401 is set on the intermediate part 402.

By repeating the above steps, semiconductor laser devices are manufactured.

As described above, according to the conventional method, even when a semiconductor laser element comprises a plurality of LD chips, an emitted light axis of only one representative LD chip is recognized with an emitted light axis recognizing part and, based on the result, a position of the semiconductor laser element is corrected to die-bond on a stem.

In the conventional method in which a semiconductor laser element with a plurality of LD chips die-bonded on one sub-mount is die-bonded on a stem of the semiconductor laser device, when the contacting part 405 is provided separately outside the transferring movable part 406, in order to recognizing an emitted light axis of a semiconductor laser element, it must be confirmed that the collet part 409 of the transferring movable part 406 has been moved out of an area above the intermediate stage part 402 and, thereafter, the contacting part 405 is moved to above the intermediate stage part 402, and the part 405 is moved down so as to contact with the semiconductor laser element.

In addition, in taking up the semiconductor laser element, for which the emitted light axis has been recognized, it must be confirmed that the contacting part 405 is moved out of an area above the intermediate stage part 402 and, thereafter, the collet part 410 on the transferring movable part 406 is moved to above the intermediate stage part 402.

Moreover, since the contacting part 405 is provided separately outside the transferring movable part 406, actuators specially for moving the contacting part 405 to above the intermediate stage part 402 and for moving up and down so as to contact with the semiconductor laser element, are necessary.

When actuators for moving collets of the collet parts (409 and 410) on the transferring movable part 406 up and down and for moving the contacting part 405 up and down are provided on the transferring movable part 406 and moved together, a transferring load increases as compared with a case where such actuators are provided separately outside the transferring movable part, and the transferring movable part 406 cannot be moved quickly to that extent.

In order to conduct shape-recognition with the camera 408 above the intermediate stage parts 402, in view of the size and arrangement of the collet parts (409 and 410) on the transferring movable part 406, the transferring movable part 406 must be temporally moved to a waiting position (where an image of the element on the intermediate stage part 402 can be taken with the camera 408), and the shape of the semiconductor laser element must be taken and treated in a state that the part 406 is halted.

In addition, according to the conventional method for manufacturing a semiconductor laser device, only one contact probe pair is provided regardless of the number of LD chips in the semiconductor laser element, an emitted light axis is recognized only for one predetermined LD chip, and the semiconductor laser element is die-bonded on a stem using the above result. Therefore, in a case where emitted light axes from two LD chips are generally parallel as shown in FIGS. 12(*a*) and 12(*b*), these emitted light axes from the two LD chips may stay in an acceptable range (see FIGS. 13(*a*) and 13(*b*)), but, on the other hand, in a case where the directions of the light axes of the two LD chips differ each other, even when the light axis of one LD chip can stay in the acceptable range, the light axis of the other LD chip lies around the limit of the range or outside the range (see FIGS. 13(c) and 13(d)). Thus, it is difficult to make all the light axes stay fully in prescribed angular ranges, leading to a high percentage of defective semiconductor laser devices.

SUMMARY OF THE INVENTION

According to the present invention, which was made in view of the above drawbacks, since all emitted light axes are adjusted by recognizing every light axis of LD chips also in a case of a semiconductor laser element comprising a plurality of LD chips, desired emitted light axes may be obtained.

According to the present method for die-bonding on a stem a semiconductor laser element with a plurality of LD chips die-bonded on one sub-mount, in a case where a contacting part is provided on a transferring movable part, a motion of moving collets on the transferring movable part out of an area above the intermediate stage part and a motion of moving the contacting part above the intermediate stage part can be conducted simultaneously in order to recognize an emission point and an emitted light axis of the semiconductor laser element, and the contacting part can be moved down to contact with the semiconductor laser element without any further motion.

In addition, also in a case where the semiconductor laser element is taken up after recognition of the emission point and the emitted light axis has been completed, a motion of moving the contacting part out of an area above the intermediate stage part and a motion of moving the collet on the transferring movable part to above the intermediate stage part can be conducted simultaneously.

Moreover, in a case where the contacting part is provide on the transferring movable part, an actuator for the transferring movable part can be used, in common, to move the contacting part to above the intermediate stage part and to move the contacting part up and down to contact with the semiconductor laser element.

Further, one or more contact probe pairs are provided depending on the number of LD chips in a semiconductor laser element in order to recognize a prescribed number of emitted light axes. Since the recognition of the emitted light axes is conducted to the prescribed plural numbers of LD chips in the semiconductor laser element, the semiconductor laser element can be die-bonded on a stem after correction of the position by using the above result so that the emitted light axes stay in their respective prescribed angular ranges. Thus, cases where any one of light emitting axes of LD chips falls outside the prescribed angular range can be reduced and, consequently, the percentage of the defective products can be reduced.

In a case where an actuator for moving the collets of the collet part and the contacting part up and down is provided separately outside the transferring movable part and is provided above the transferring movable part, since a transferring load can be decreased as compared with a case where such actuators are provided on the transferring movable part and moved together with the transferring movable part, the transferring movable part can be moved more quickly to that extent.

In addition, the shape of the semiconductor laser element can be taken with a camera provided above the intermediate stage part and can be treated during a motion of driving the transferring movable part without moving and halting the transferring movable part into a waiting position temporally, by reducing a size of the collets on the transferring movable part and expanding a distance between the contacting part and the collet part nearest to the element sheet part.

More specifically, the present invention provides an apparatus for manufacturing a semiconductor laser device, which comprises:

an element sheet part for supplying a semiconductor laser device in which one or more LD chips are die-bonded on one sub-mount;

an intermediate stage part for correcting a position of the supplied semiconductor element;

an emitted light axis recognizing part for recognizing an emission point and an emitted light axis of the semiconductor laser element set on the intermediate stage part;

a die-bonding part for die-bonding on a stem the semiconductor laser element, a position of which has been corrected; and a transferring movable part for transferring the semiconductor laser element to any parts, wherein said transferring movable part is provided with:

at least two collet parts; and one or more contacting parts having a contact probe pair for contacting with the LD chips and with the corresponding electrode patterns on the sub-mount in order to energize the LD chips in the semiconductor laser element to emit lights.

According to the apparatus for manufacturing the semiconductor laser device of the present invention, a motion of moving collets on the transferring movable part out of an area above the intermediate stage part and a motion of moving the contacting part above the intermediate stage part can be conducted simultaneously in order to recognize an emission point and an emitted light axis of the semiconductor laser element, and the contacting part can be moved down to contact with the semiconductor laser element without any further motion. Therefore, a time for confirming that the collet part has been moved out of an area above the intermediate stage part and a time for moving the contacting part to the intermediate stage part thereafter can be shortened.

In addition, also when the semiconductor laser element is taken up after recognition of the emission point and the emitted light axis has been completed, a motion of moving the contacting part out of an area above the intermediate stage part and a motion of moving the collet on the transferring movable part to above the intermediate stage part can be conducted simultaneously. Therefore, a time for confirming that the contacting part has been moved out of an area above the intermediate stage part and a time for moving the collet part to above the intermediate stage part can be shortened.

Moreover, since an actuator for the transferring movable part can be used, in common, as an actuator to move the contacting part to above the intermediate stage part and to move the contacting part up and down to contact with the semiconductor laser element, the number of actuators can be relatively reduced.

Since the apparatus for manufacturing a semiconductor laser device according to the present invention further comprises cameras for recognizing a shape of the semiconductor laser element at the element sheet part and at the intermediate stage part, the shape-recognition and treatment of the semiconductor laser element can be conducted with the camera provided on an upper area of the transferring movable part during the motion of transferring and, consequently, the shape-recognition and treatment of the semiconductor laser element can be conducted more quickly than in a case where the shape-recognition and treatment is conducted while the transferring movable part is halted in a waiting position.

Since the apparatus for manufacturing a semiconductor laser device according to the present invention further comprises actuators for driving the at least two collet parts and the one or more contacting parts up and down, and said actuators are provided separately outside the transferring movable part, a transferring load can be decreased as compared with a case where such actuators are provided on the transferring movable part and moved together with the transferring movable part and, consequently, the transferring movable part can be moved more quickly to that extent.

In a first embodiment of the present apparatus for manufacturing a semiconductor laser device, the contacting part is provided with one or more contact probe pairs disposed to correspond to positions of one or more LD chips in the semiconductor laser element set on the intermediate stage part and the positions of the corresponding electrode patterns on the sub-mount.

In a second embodiment of the present apparatus for manufacturing a semiconductor laser device, the contact part is provided with more than one contact probe pairs, which are disposed at respective positions shifted by a prescribed distance form each position of the plurality of LD chips in the semiconductor laser element set on the intermediate stage part and from each corresponding positions of the electrodes patterns on the sub-mount towards an orthogonal direction to a light emitting direction, while keeping the relative positional relationship between electrode patterns on the sub-mount as a pair.

Thereby, also when an interval between LD chips in the semiconductor laser element is narrow, relatively large contact probes can be used. In addition, since it is not necessary to use a thin and short-life contact probe, relatively stable operation of the apparatus can be achieved.

In a third embodiment of the present apparatus for manufacturing a semiconductor laser device, the contacting part is provided with more than one contact probe pairs, which are disposed at respective positions shifted by a prescribed distance from each position of the plurality of LD chips in the semiconductor laser element set on the intermediate stage part and from each corresponding position of the electrode patterns on the sub-mount towards a parallel direction to the direction of the light emission, while keeping the relative positional relationship between electrode patterns on the sub-mount as a pair, and heights of the contact probe pairs are such that the height of the contact probe pair in front of a light emitting direction is set to be greater.

Thereby, also when an interval between LD chips in the semiconductor laser element is narrow, relatively large contact probes can be used, without blocking an emitted light axis with the contacting part when the emitted light axis recognition and treatment are conducted with the emitted light axis recognizing part. In addition, since it is not necessary to use a thin and short-life contact probe, relatively stable operation of the apparatus can be achieved.

In the present apparatus for manufacturing a semiconductor laser device, the contacting part is placed outside the collet part nearest to the die-bonding part.

Thereby, a tact time can be shortened to manufacture a semiconductor laser device effectively.

In the present apparatus for manufacturing a semiconductor laser device, the contacting part is placed between one collet part and another collet part.

Thereby, a semiconductor laser device can be manufactured effectively in a tact time.

In a case where the contacting part is placed between one collet part and another collet part, since the contacting part is disposed by the collet part nearest to the die-bonding part, a relatively long time can be secured for taking an image to conduct shape recognition and treatment by using a camera above the transferring movable part during a motion of moving the transferring movable part.

Further, the present invention provides a method for manufacturing a semiconductor laser device, which enables any axes of lights emitted from respective LD chips in the semiconductor laser element comprising a plurality of LD chips to stay in a prescribed angular range.

More specifically, the present invention provides a method for manufacturing a semiconductor laser device, which comprises:

a step of taking up a semiconductor laser element, in which one of more LD chips are die-bonded on one sub-mount, from an element sheet part, and transferring said semiconductor laser element to an intermediate stage part;

a step of correcting a position of said semiconductor laser element on the intermediate stage part by recognizing its shape;

a step of emitting the one or more LD chips on the intermediate stage part;

a step of conducting recognition of emission points and emitted light axes of the one or more LD chips;

a step of correcting a position of the semiconductor laser element based on the results of the recognition of emission points and emitted light axes;

a step of transferring to a die-bonding part the semiconductor laser element, a position of which has been corrected; and a step of die-bonding the semiconductor laser element on a stem.

Particularly, in the present method for manufacturing a semiconductor laser device, shape-recognition and treatment of the semiconductor laser element are conducted with a camera provided above the transferring movable part during a motion of moving the transferring movable part; and a position of the semiconductor laser element is corrected.

Thereby, cases where any one of the emitted light axes of the one or more LD chips falls outside a prescribed angular range can be reduced comparatively (see FIG. 14).

In the present method for manufacturing a semiconductor laser device, by using an apparatus for manufacturing a semiconductor laser device comprising a contacting part which is provided with one or more contact probe pairs depending on the position of one of more LD chips in the semiconductor laser element set on the intermediate stage part and the positions of the corresponding electrode patterns on the sub-mount, one or more of a plurality of LD chips in a semiconductor laser element are emitted at once;

each of emitted light axes of one or more of the plurality of LD chips is recognized with an emitted light axis recognizing part; and a position of each emitted light axis is corrected so as to stay in respective prescribed angular ranges based on the recognition results.

Thereby, a plurality of emitted light axes can be taken at once with a camera to recognize the emitted light axes and, therefore, correction of the positions can be completed relatively in a short time. Since the correction of the positions are conducted based on the above recognition results, cases where any one of the emitted light axes of the one or more LD chips falls outside a prescribed angular range can be reduced comparatively (see FIG. 14).

In the present method for manufacturing a semiconductor laser device, by using an apparatus for manufacturing a semiconductor laser device comprising a mechanism which is provided with more than one contact probe pairs depending on the position of one of more LD chips in the semiconductor laser element set on the intermediate stage part and the positions of the corresponding electrode patterns on the sub-mount, and is capable of transferring the emitted light axis recognizing part to a predetermined position of the LD chip, one of a plurality of LD chips in a semiconductor laser element is emitted;

emitted light axes of one of the plurality of LD chips are recognized with an emitted light axis recognizing part;

a contacting part is moved by a prescribed distance;

next one of the plurality of LD chips is emitted;

an emitted light axis of the next one of a plurality of LD chips is recognized with the emitted light axis recognizing part;

a prescribed number of emitted light axes are recognized successively every one of the remaining one LD chips with the emitted light axis recognizing part in the same procedures as described above; and a position of each emitted light axis is corrected so as to stay in respective prescribed angular ranges based on the recognition results.

Thereby, all of the emitted light axes of the one or more LD chips in the semiconductor laser element are taken in one recognizing camera field, the emitted light axes of the plurality of LD chips in the semiconductor laser element can be recognized without reducing resolution of the recognizing camera further than needed and, therefore, the recognition accuracy can be improved comparatively.

In the present method for manufacturing a semiconductor laser device, by using the apparatus according to the second or third embodiment of the present invention, one or more of a plurality of LD chips in a semiconductor laser element is emitted;

emitted light axes of the one or more of a plurality of LD chips are recognized with an emitted light axis recognizing part;

a contacting part is moved by a prescribed distance;

next one or more of the plurality of LD chips are emitted;

emitted light axes of the next one or more of a plurality of LD chips are recognized with the emitted light axis recognizing part;

a prescribed number of emitted light axes are recognized successively every one or more of the remaining LD chips with the emitted light axis recognizing part by the same procedures as described above; and a position of each emitted light axis is corrected so that the prescribed number of emitted light axes stay in respective prescribed angular ranges based on the recognition results.

Thereby, all of the emitted light axes of the LD chips in the semiconductor laser element are taken in one recognizing camera field, the emitted light axes of the plurality of LD chips in the semiconductor laser element can be recognized without reducing resolution of the recognizing camera further than needed and, therefore, the recognition accuracy can be improved comparatively.

In the present method for manufacturing a semiconductor laser device, by using the apparatus according to the second or third embodiment of the present invention, one or more of a plurality of LD chips in a semiconductor laser element is emitted;

emitted light axes of one or more of the plurality of LD chips is recognized with an emitted light axis recognizing part;

a contacting part and the emitting light axis recognizing part is moved by respective prescribed distances;

next one or more of the plurality of LD chips is emitted;

emitted light axes of the next one or more of a plurality of LD chips are recognized with the emitted light axis recognizing part;

a prescribed number of emitted light axes are recognized successively every one or more of the remaining LD chips with the emitted light axis recognizing part by the same procedures as described above; and a position of each emitted light axis is corrected so that the prescribed number of emitted light axes stay in respective prescribed angular ranges based on the recognition results.

Thereby, also when an interval between LD chips in the semiconductor laser element is narrow, relatively stable operation of the apparatus can be achieved, and all of the emitted light axes of the LD chips in the semiconductor laser element are taken in one recognizing camera field, the emitted light axes of the plurality of LD chips in the semiconductor laser element can be recognized without reducing resolution of the recognizing camera further than needed and, therefore, the recognition accuracy can be improved comparatively.

In the present method for manufacturing a semiconductor laser device, by using the apparatus according to the second or third embodiment of the present invention, one or more of a plurality of LD chips in a semiconductor laser element are emitted;

emitted light axes of one or more of the plurality of LD chips are recognized with an emitted light axis recognizing part;

a contacting part and the intermediate stage part is moved by respective prescribed distances;

next one or more of the plurality of LD chips are emitted;

emitted light axes of the next one or more of a plurality of LD chips are recognized with the emitted light axis recognizing part;

a prescribed number of emitted light axes are recognized successively every one or more of the remaining Semiconductor laser chips with the emitted light axis recognizing part by the same procedures as described above; and a position of each emitted light axis is corrected so that the prescribed number of emitted light axes stay in respective prescribed angular ranges based on the recognition results.

Thereby, also when an interval between LD chips in the semiconductor laser element is narrow, relatively stable operation of the apparatus can be achieved, and all of the emitted light axes of the LD chips in the semiconductor laser element are taken in one recognizing camera field, the emitted light axes of the plurality of LD chips in the semiconductor laser element can be recognized without reducing resolution of the recognizing camera further than needed and, therefore, the recognition accuracy can be improved comparatively.

In the present method for manufacturing a semiconductor laser device, a semiconductor laser element is regarded as a defective product, when each emitted light axis of LD chips in the semiconductor laser element, and an angular difference between the emitted light axes are away from falls outside a respective prescribed angular range without die-bonding.

Particularly, in the present method for manufacturing a semiconductor laser device, since, in view of yielding defective products, only a semiconductor laser element, in which an angle made with two axes of lights emitted from the semiconductor laser element stays in a prescribed range, is die-bonded on a stem, unnecessary steps in a subsequent process can be reduced and wasted materials can be reduced.

In the present method for manufacturing a semiconductor laser device, feedback processing is conducted to a process for manufacturing a semiconductor laser element by die-bonding a plurality of LD chips, when each emitted light axis of LD chips in the semiconductor laser element, and relative angle of each emitted light axis to the sub-mount are away form respective prescribed angular ranges.

Thereby, occurrence of misregister with a tendency is predicted, and since this occurrence of misregister can be corrected at an earlier stage, a percentage of defective products can be reduced.

In the present method for manufacturing a semiconductor laser device, feedback processing is conducted to a process for manufacturing a semiconductor laser element by die-bonding a plurality of LD chips, when each emitted light axis of the LD chips in the semiconductor laser element, and an angular difference between the emitted light axes are away from respective prescribed angular ranges.

Thereby, occurrence of misregister with a tendency is predicted, and since this occurrence of misregister can be corrected at an earlier stage, a percentage of defective products can be reduced.

Further, the present invention provides a semiconductor laser device, which is manufactured by die-bonding on a stem a semiconductor laser element with a plurality of LD chips die-bonded on one sub-mount, an axis of light emitted from at least one of LD chips being consistent with a reference axis which is an axis lying at a prescribed angle relative to a reference surface of the stem. Preferably, the reference axis lies at right angle relative to the reference surface of the stem.

Particularly, in the present semiconductor laser device, an emitted light axis of an LD chip is consistent with the reference axis, said LD chip emitting light with a shortest wavelength among the plurality of LD chips.

Still further, the present invention also provides a semiconductor laser device, which is manufactured by die-bonding on a stem a semiconductor laser element with a plurality of LD chips die-bonded on one sub-mount, an axis lying at an average angle among angles of light emitted axes of the plurality of LD chips being consistent with a reference axis which is an axis lying at a prescribed angle relative to a reference surface of the stem.

Yet further, the present invention provides an optical pickup comprising a semiconductor laser device as defined in any one of claims 21 to 23 and a condensing lens, wherein a reference surface of the optical pickup disposed at a prescribed angle relative to an optic axis of the condensing lens is consistent with a reference surface of a stem of the semiconductor laser device.

BRIEF DESCRIPTION OF THE INVENTION

DETAILED DESCRIPTION OF THE INVENTION

The apparatus and method for manufacturing a semiconductor laser device according to the present invention will be explained in detail below with referring to the appended drawings. However, it is to be understood that the drawings and the following examples are only intended to illustrate the present invention, and the semiconductor laser device, and the apparatus and the method for manufacturing said semiconductor laser device are not limited to the following constitutions.

Figure 5:
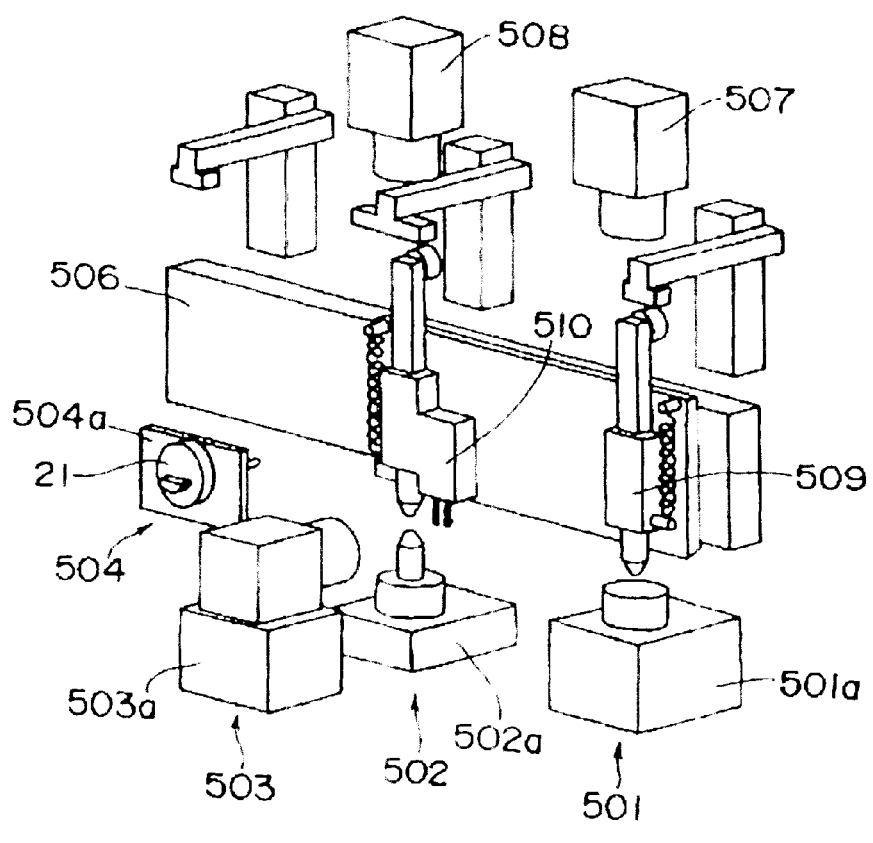
FIG. 5 shows a schematic perspective view of an apparatus for manufacturing a semiconductor laser device according to the present invention.
Figure 5:
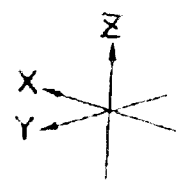

A. Constitution of the Present Apparatus for Manufacturing a Semiconductor Laser Device As shown in FIG. 5, the present apparatus for manufacturing a semiconductor laser device comprises an element sheet part 501, an intermediate stage part 502, an emitted light axis recognizing part 503, a die-bonding part 504, a transferring movable part 506, shape-recognizing cameras (507 and 508) and others.

The element sheet part 501 is a part for supplying a semiconductor laser element in which one or more LD chips are die-bonded on one sub-mount in a previous process.

The intermediate stage part 502 is a part for correcting a position of the supplied semiconductor laser element by shape-recognition and the like.

The emitted light axis recognizing part 503 is a part for measuring by recognition of emission points, emitted light axes and the like, and has an XY-axis actuator as a mechanism for capturing a plurality of emission points and emitted light axes.

The die-bonding part 504 is a part for die-bonding the semiconductor laser element, a position of which has been corrected, on a stem 201 of a semiconductor laser device 21.

The transferring movable part 506 comprises a collet part 509 having one collet, and a collet and contacting part 510 comprising a collet part having one collet and a contacting part having one or more contact probe pairs. The collet part 509 and the collet and contacting part 510 are moved up and down with Z-axis actuators. The contacting part may be attached, for example, to the collet part nearest to the die-bonding part, and disposed between two collet parts.

Figure 6:
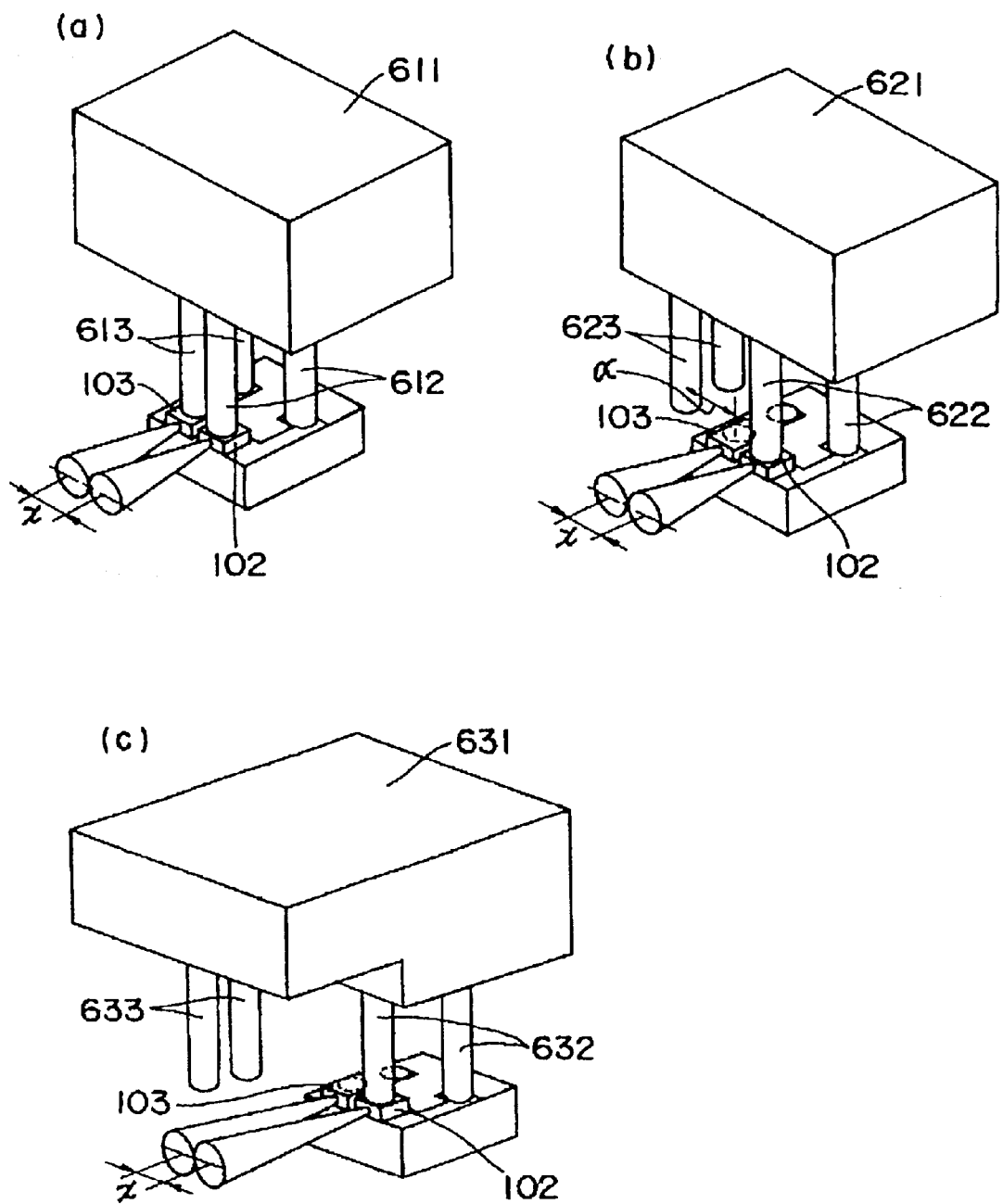
FIG. 6 shows an enlarged perspective view schematically illustrating a first, second and third embodiment of contact probes in the apparatus for manufacturing a semiconductor laser device according to the present invention.

In the contacting part according to the present invention, the one or more contact probe pairs are disposed as shown in FIGS. 6(*a*), 6(*b*) and 6(*c*). Additionally, FIGS. 6(*a*), 6(*b*) and 6(*c*) show examples of contacting parts having a suitable type for use in a semiconductor laser element 1, in which one red LD chip 102 and one infrared LD chip 103 are mounted on one sub-mount.

In a first type of contacting part, as shown in FIG. 6(*a*), a contact probe pair 612 for energizing the red LD chip 102 and a contact probe pair 613 for energizing the infrared LD chip 103 are held by an insulator 611 to connect each contact probe with an electrical circuit (not shown). In the contact probe pair, one probe contacts with the LD chip and the other probe contacts with an electrode pattern on which the LD chip is die-bonded so as to energize the LD chip.

Two contact probe pairs are disposed so that they can contact with two sets of an LD chip and an electrode patterns on which the LD chip is die-bonded, simultaneously.

In a second type of contacting part, as shown in FIG. 6(*b*), in a similar manner to the first type of contacting part, a contact probe pair 622 for energizing the red LD chip 102 and a contact probe pair 623 for energizing the infrared LD chip 103 are held by an insulator 621 to connect each contact probe with an electrical circuit (not shown).

In the second type of contacting part, unlike the first type of contacting part, the two contact probe pairs are disposed so that an interval between the two contact probe pairs is wider by an offset (α) than that between two sets of an LD chip and an electrode pattern on which the LD chip is die-bonded.

In a third type of contacting part, as shown in FIG. 6(*c*), a contact probe pair 632 for energizing the red LD chip 102 and a contact probe pair 633 for energizing the infrared LD chip 103 are held by an insulator 631 to connect each contact probe with an electrical circuit (not shown).

Figure 10:
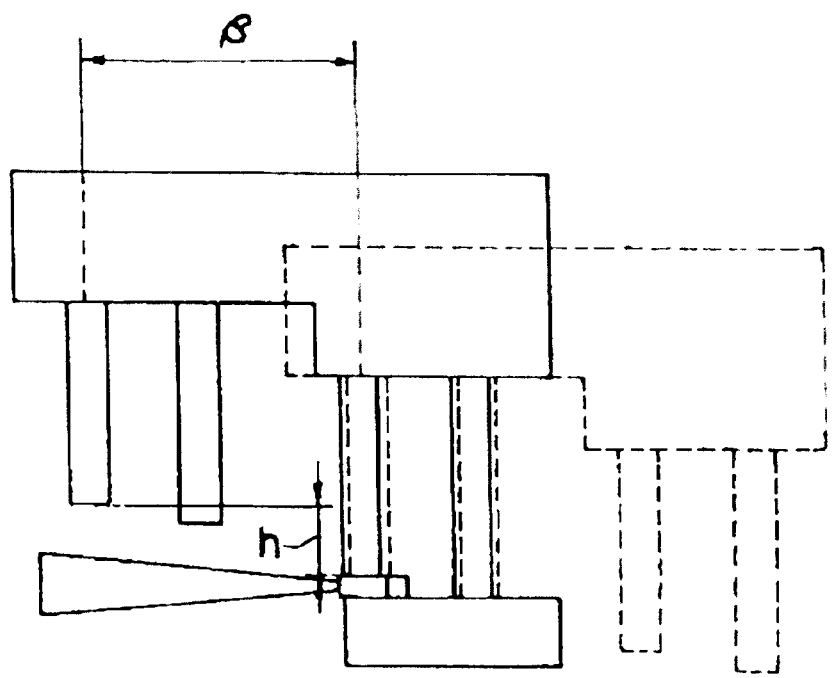
FIG. 10 shows a schematic cross-sectional view of the third embodiment of contact probes, seen from an orthogonal direction to the emitted light axes, of the apparatus for manufacturing a semiconductor laser device according to the present invention.

In the third type of contacting part, unlike the first and second types of contacting part, one contact probe pair is shifted by an offset (β) forward in a direction of an emitted light axis and, further, shifted above by a height (h). Thereby, the probes do not block a broadened light emitted from the third type of contacting part (see FIG. 10).

B. Method for Manufacturing a Semiconductor Laser Device

EXAMPLE 1

Figure 7:
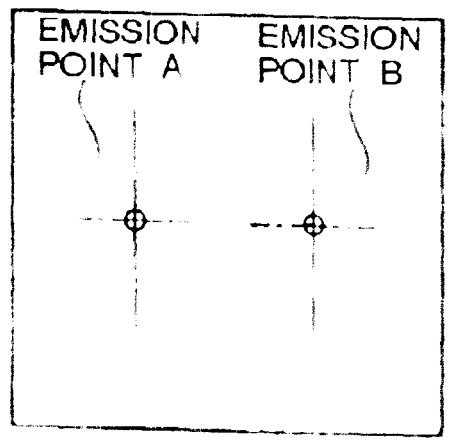
FIG. 7 shows images of emitted light axes taken with an emitted light axis recognizing part of the apparatus for manufacturing a semiconductor laser device according to the present invention.
Figure 7:
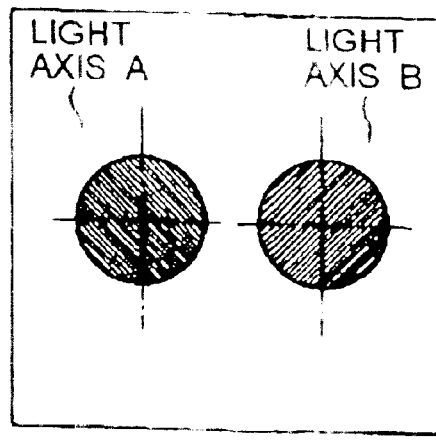

As a first embodiment of the present invention, the case where two emitted light axes are recognized at once with a camera of an emitted light recognizing part by using a contacting part in which probes are disposed as shown in FIG. 6(*a*), will be explained below (see FIG. 7).

(1-1) Shape-recognition of a semiconductor laser element set on an element sheet part 501 is conducted with a camera 507 provided above the element sheet part 501.

(1-2) A transferring movable part 506 is moved right, and the collet part 509 is then moved up and down above the element sheet part 501 to take up the above semiconductor laser element, a position of which has been corrected by shape-recognizing.

(1-3) The transferring movable part 506 is moved left, and a collet part 509 is then move up and down to set the above semiconductor laser element taken up on the intermediate stage part 502.

(1-4) During a motion of transferring a collet and contacting part 510 to a predetermined position of the semiconductor laser element on the intermediate stage part 502 without halting the transferring movable part 506 in a waiting position, shape-recognition of the above semiconductor laser element set on the intermediate stage part 502 is conducted with a camera 508 provided above the intermediate stage part 502.

(1-5) During shape-recognition of the above semiconductor laser element set on the intermediate stage part 502, a next semiconductor laser element set on the element sheet part 501 is shape-recognized with the camera 507 provided above the element sheet part 501 according to the same procedures as those described above.

(1-6) In order to recognize the emitted light axes of the semiconductor laser element, a position of which has been corrected, on the intermediate stage part 502, the collet and contacting part 510 is moved down, the emitted light axes of the two predetermined LD chips are recognized at once with the camera of the emitted light axis recognizing part 503, and a position of the semiconductor laser element is corrected so that emitted light axes stay in respective prescribed angular ranges based on the recognition results.

(1-7) Based on the above recognition results, when each emitted light axis of the LD chips in the semiconductor laser element, and an angular difference between the emitted light axes fall outside respective prescribed angular ranges, the semiconductor laser element is regarded as a defective product and, then, it is forwarded to a defective products treatment cycle without die-bonding.

(1-8) Based on the above recognition results, when each emitted light axis of the LD chips in the semiconductor laser element, and a relative angle of each emitted light axis to the sub-mount as determined by shape-recognition of the semiconductor laser element falls outside respective prescribed angular ranges, recognition data are transferred to a previous process for feedback processing.

(1-9) Based on the above recognition results, when each emitted light axis of the LD chips in the semiconductor laser element, and an angular difference between the emitted light axes fall outside respective prescribed angular ranges, recognition data are transferred to a previous process for feedback processing.

(1-10) The collet and contacting part 510 is once moved up, the transferring movable part 506 is moved right, the collet and contacting part 510 is moved up and down again to take up the above semiconductor laser element on the intermediate stage part 502, for which the emission point and the emitted light axes have been recognized.

(1-11) During taking up the semiconductor laser element on the intermediate stage 502, the collet part 509 is moved up and down above the element sheet part 501 to take up the semiconductor laser element according to the same procedures as those described above.

(1-12) The transferring movable part 506 is moved left, and the collet and contacting part 510 above the die-bonding part 504 is then moved up and down to die-bond the above semiconductor laser element taken up from the intermediate stage part 502 on a stem 201 of a semiconductor laser device 21.

(1-13) During die-bonding the semiconductor laser element taken up from the intermediate stage part 502 on a stem 201, another semiconductor laser element taken up from the element sheet part 501 is similarly set on the intermediate stage part 502 according to the same procedures as those described above.

By repeating the above procedures, semiconductor laser devices are manufactured with the apparatus for manufacturing a semiconductor laser device.

EXAMPLE 2

As a second embodiment of the present invention, a case where an emitted light axis of a first LD chip is recognized with a camera in the emitted light recognizing part 503, the emitted light axis recognizing part is then moved by an interval between the emitted light axes (x), and an emitted light axis of the remaining one LD chip is recognized by using a contacting part in which probes are disposed as shown in FIG. 6(a), will be explained below (see FIG. 8).

(2-1~5) A semiconductor laser element is set on the intermediate stage part 502 according to the same procedures as those described in Example 1.

(2-6) In order to conduct recognition of the emitted light axes of the semiconductor laser element set on the intermediate stage part 502, a shape of which has been recognized, the collet and contacting part 510 is moved down to recognize the emitted light axis of the first LD chip with the emitted light axis recognizing camera 503 (FIGS. 8(a) and 8(c)).

(2-7) In order to conduct recognition of the emitted light axis of the remaining one LD chip, the emitted light axis recognizing part 503 is moved by an interval between the emitted light axes (x), the emitted light axis of the remaining one LD chip is then recognized with the emitted light axis recognizing camera 503 (FIGS. 8(b) and 8(d)). Based on the recognition results, a position of the semiconductor laser element is corrected so that each emitted light axes stay in their respective prescribed angular ranges.

(2-8) A defective product treatment cycle, each feedback processing and die-bonding on a stem are conducted according to the same procedures as those in Example 1 described above.

By repeating the above procedures, semiconductor laser devices are manufactured with the apparatus for manufacturing a semiconductor laser device.

EXAMPLE 3

Figure 9:
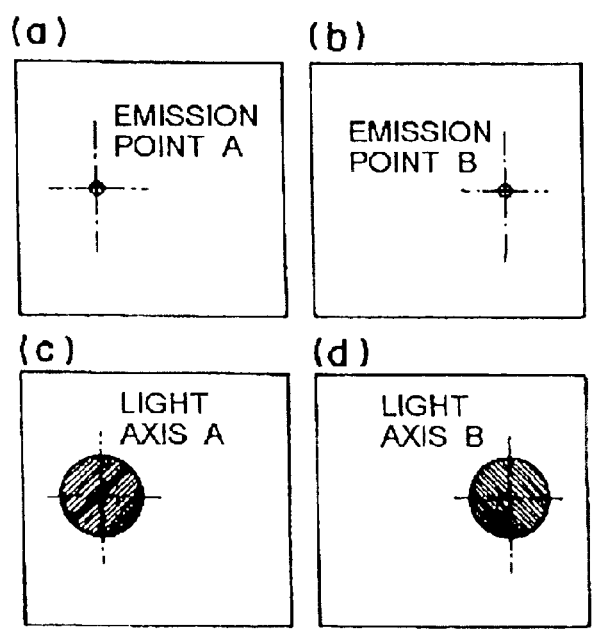
FIG. 9 shows images of emitted light axes taken with an emitted light axis recognizing part of the apparatus for manufacturing a semiconductor laser device according to the present invention.

As a third embodiment of the present invention, a case where an emitted light axis of a first LD chip is recognized with a camera in the emitted light recognizing part 503, the emitted light axis recognizing part is then moved by an offset (α), and an emitted light axis of the remaining one LD chip is recognized by using a contacting part in which probes are disposed as shown in FIG. 6(b), will be explained below (see FIG. 9).

(3-1~5) A semiconductor laser element is set on the intermediate stage part 502 according to the same procedures as those described in Example 1.

(3-6) In order to conduct recognition of the emitted light axes of the semiconductor laser element set on the intermediate stage part 502, a shape of which has been recognized, the collet and contacting part 510 is moved down to recognize the emitted light axis of the first LD chip with the emitted light axis recognizing camera 503 (FIGS. 9(a) and 9(c)).

(3-7) In order to conduct recognition of the emitted light axis of the remaining one LD chip, the collet and contacting part 510 is moved by the offset (α), the emitted light axis of the remaining one LD chip is then recognized with the emitted light axis recognizing camera 503 (FIGS. 9(b) and 9(d)). Based on the recognition results, a position of the semiconductor laser element is corrected so that each emitted light axes stay in their respective prescribed angular ranges.

(3-8) A defective product treatment cycle, each feedback processing and die-bonding on a stem are conducted according to the same procedures as those in Example 1 described above.

By repeating the above procedures, semiconductor laser devices are manufactured with the apparatus for manufacturing a semiconductor laser device.

EXAMPLE 4

Figure 8:
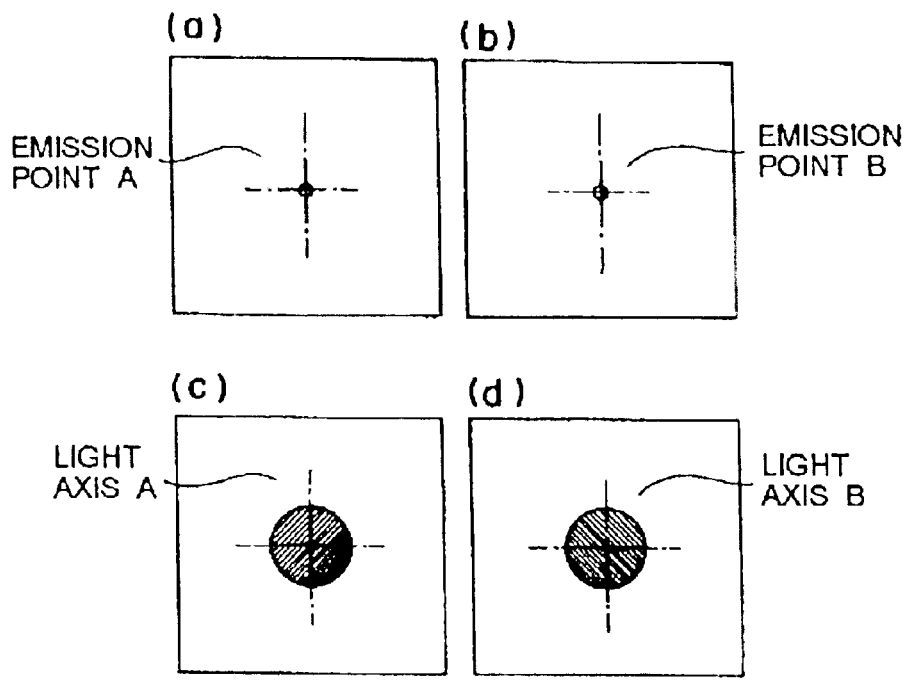
FIG. 8 shows images of emitted light axes taken with an emitted light axis recognizing part of the apparatus for manufacturing a semiconductor laser device according to the present invention.

As a forth embodiment of the present invention, a case where an emitted light axis of a first LD chip is recognized with a camera in the emitted light recognizing part 503, the emitted light axis recognizing part is then moved by an interval between the emitted light axes (x), the collet and contacting part 510 is moved by an offset (α), and an emitted light axis of the remaining one LD chip is recognized, by using a contacting part in which probes are disposed as shown in FIG. 6(b), will be explained below (see FIG. 8).

(4-1~5) A semiconductor laser element is set on the intermediate stage part 502 according to the same procedures as those described in Example 1.

(4-6) In order to conduct recognition of the emitted light axes of the semiconductor laser element set on the intermediate stage part 502, a shape of which has been recognized, the collet and contacting part 510 is moved down to recognize the emitted light axis of the first LD chip with the emitted light axis recognizing camera 503 (FIGS. 8(a) and 8(c)).

(4-7) In order to conduct recognition of the emitted light axis of the remaining one LD chip, the emitted light axis recognizing part 503 is moved by the interval between the emitted light axes (x) and the collet and contacting part 510 is moved by the offset (α), the emitted light axis of the remaining one LD chip is then recognized with the emitted light axis recognizing camera 503 (FIGS. 8(b) and 8(d)). Based on the recognition results, a Position of the semiconductor laser element is corrected so that each emitted light axes stay in their respective prescribed angular ranges.

(4-8) A defective product treatment cycle, each feedback processing and die-bonding on a stem are conducted according to the same procedures as those in Example 1 described above.

By repeating the above procedures, semiconductor laser devices are manufactured with the apparatus for manufacturing a semiconductor laser device.

EXAMPLE 5

As a fifth embodiment of the present invention, the case where an emitted light axis of a first LD chip is recognized with a camera in the emitted light recognizing part 503, the intermediate stage part 502 is then moved by an interval between the emitted light axes (x), the collet and contacting part 510 is moved by an offset (α), and is further moved by the interval between the emitted light axes (x), and an emitted light axis of the remaining LD chip is recognized, by using a contacting part in which probes are disposed as shown in FIG. 6(*b*), will be explained below (see FIG. 8).

(5-1~6) A semiconductor laser element is set on the intermediate stage part 502 according to the same procedures as those described in Example 1.

(5-7) In order to conduct recognition of the emitted light axes of the semiconductor laser element set on the intermediate stage part 502, a shape of which has been recognized, the collet and contacting part 510 is moved down to recognize the emitted light axis of the first LD chip with the emitted light axis recognizing camera 503 (FIGS. 8(*a*) and 8(*c*)).

(5-8) In order to conduct recognition of the emitted light axis of the remaining one LD chip, the intermediate stage part 502 is moved by the interval between the emitted light axes (x) and the collet and contacting part 510 is moved by the offset (α), and is further moved by the interval between the emitted light axes (x), and the emitted light axis of the remaining LD chip is then recognized with the emitted light axis recognizing camera 503 (FIGS. 8(*b*) and 8(*d*)). Based on the recognition results, a position of the semiconductor laser element is corrected so that each emitted light axes stay in their respective prescribed angular ranges.

(5-9) A defective product treatment cycle, each feedback processing and die-bonding on a stem are conducted according to the same procedures as those in Example 1 described above.

By repeating the above procedures, semiconductor laser devices are manufactured with the apparatus for manufacturing a semiconductor laser device.

EXAMPLE 6

As a sixth embodiment of the present invention, a case where two emitted light axes are recognized by using a contacting part in which probes are disposed as shown in FIG. 6(*c*), will be explained below.

(6-1~6) An emitted light axis of a first LD chip is recognized according to the same procedures as described in Examples 3, 4 and 5.

(6-7) The emitted light axis of the remaining LD chip is recognized according to the same procedures as those described above, except that the collet and contacting part 510 is moved by the offset (β) in a direction parallel to the direction of the light emission, and is further moved above by a height (h).

(6-8) Based on the recognition results, a position of the semiconductor laser element is corrected so that each emitted light axes stay in their respective prescribed angular ranges.

(6-9) A defective product treatment cycle, each feedback processing and die-bonding on a stem are conducted according to the same procedures as those in Example 1 described above.

By repeating the above procedures, semiconductor laser devices are manufactured with the apparatus for manufacturing a semiconductor laser device.

EXAMPLE 7

As a seventh embodiment of the present invention, a case where emitted light axes of two LD chips are recognized by using a collet and contacting part 510', in which the contacting part is changed to be disposed outside the collet part in place of between two collet parts in the collet and contacting part 510, in the apparatus for manufacturing a semiconductor laser device as shown in FIG. 5, will be explained below.

(7-1) Shape-recognition of a semiconductor laser element 1 set on an element sheet part 501 is conducted with a camera 507 provided above the element sheet part 501.

(7-2) A transferring movable part 506 is moved right, and the collet part 509 is then moved up and down above the element sheet part 501 to take up the above semiconductor laser element 1, a position of which has been corrected by shape-recognizing.

(7-3) The transferring movable part 506 is moved left, and the collet part 509 is then move up and down to set the above semiconductor laser element 1 taken up on the intermediate stage part 502.

(7-4) During a motion of transferring the collet and contacting part 510' to a predetermined position of the semiconductor laser element 1 on the intermediate stage part 502 without halting the transferring movable part 506 in a waiting position, shape-recognition of the above semiconductor laser element 1 set on the intermediate stage part 502 is conducted with a camera 508 provided above the intermediate stage part 502.

(7-5) During shape-recognition of the semiconductor laser element on the intermediate stage part 502, a next semiconductor laser element 1' set on the element sheet part 501 is shape-recognized with the camera 507 provided above the element sheet part 501 according to the same procedures as those described above.

(7-6) The emitted light axes of the semiconductor laser element 1 set on the intermediate stage part 502, a shape of which has been recognized, are recognized in the manner depending on the feature of the collet and contacting part 510' shown above. Based on the recognition results, a position of the semiconductor laser element is corrected so that each emitted light axes stay in their respective prescribed angular ranges.

(7-7) Based on the above recognition results, when each emitted light axis of the LD chips in the semiconductor laser element, and an angular difference between the emitted light axes fall outside respective prescribed angular ranges, the semiconductor laser element is regarded as a defective product, and it is then forwarded to a defective product treatment cycle without die-bonding.

(7-8) Based on the above recognition results, when each emitted light axis of the LD chips in the semiconductor laser element 1, and a relative angle of each emitted light axis relative to the sub-mount as determined by shape-recognition of the semiconductor laser element falls outside respective prescribed angular ranges, the obtained data are transferred to a previous process for feedback processing.

(7-9) Based on the above recognition results, when each emitted light axis of the LD chips in the semiconductor laser element 1, and an angular difference between the emitted light axes fall outside respective prescribed angular ranges, the obtained data are transferred to a previous process for feedback processing.

(7-10) During recognition of the emitted light axes, the collet part 509 above the element sheet part 501 is moved up and down to take up the semiconductor laser element 1' according to the above procedures.

(7-11) The contacting part 509 is moved up, the transferring movable part 506 is moved left, and the collet and contacting part 510' is moved up and down to take up the semiconductor laser element 1, for which the emitted light axis have been recognized.

(7-12) The transferring movable part 506 is moved left, and the collet and contacting part 510' above the die-bonding part 504 is then moved up and down to die-bond the above semiconductor laser element 1, taken up from the intermediate stage part 502, on a stem 201 of a semiconductor laser device 21.

(7-13) During die-bonding the semiconductor laser element 1 taken up from the intermediate stage part 502 on the stem 201, the semiconductor laser element 1' taken up from the element sheet part 501 is similarly set on the intermediate stage part 502 according to the above procedures.

By repeating the above procedures, semiconductor laser devices are manufactured with the apparatus for manufacturing a semiconductor laser device.

C. Semiconductor Laser Device

In a case where a semiconductor laser element is formed by die-bonding two LD chips, one emitting a red light and the other emitting an infrared light, on one sub-mount, one LD chip vacuumed with a collet for die-bonding is emitted to recognize the light axis thereof, and the LD chip is die-bonded referring to a predetermined region of the sub-mount. Next, a light axis of the other LD chip is recognized by the same procedures, and the other LD chip is die-bonded so that its light axis is consistent with the light axis of the former LD chip.

Figure 12:
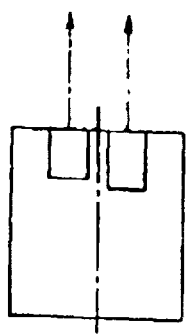
FIG. 12 shows a schematic plan view indicating axes of lights emitted form LD chips in a semiconductor laser element.
Figure 12:
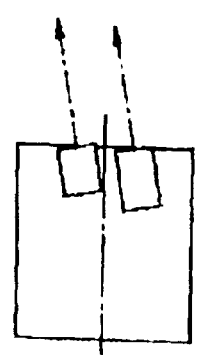
Figure 12:
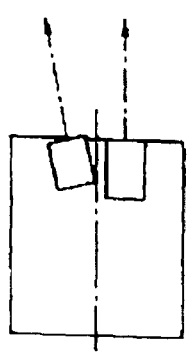
Figure 12:
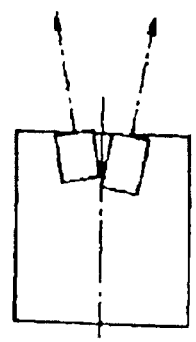

In this case, if the light axes of the two LD chips are parallel each other, when these two LD chips are mounted on a stem of a semiconductor laser device, as shown in FIGS. 12(a) and 12(b), it is possible to make the emitted light axes of the two LD chips stay in their prescribed angular ranges based on the stem, even by using the conventional method for manufacturing a semiconductor laser device, in which only an emitted light axis of one LD chip is recognized to correct a position of the element.

However, actually, emitted light axes of two LD chips are not necessarily parallel each other due to influences by the accuracy in measurement and die-bonding. For example, as shown in FIG. 11(a), the emitted light axes of two LD chips are not consistent with a reference direction based on the sub-mount.

Therefore, in a case where a semiconductor laser device is manufactured by die-bonding on a stem a semiconductor laser element in which a plurality of LD chips are die-bonded on one sub-mount, the emitted light axes of all the LD chips are recognized at once or one by one, to die-bond the semiconductor laser element so that the emitted light axes stay in their prescribed angular ranges based on the reference part of the stem.

Figure 11:
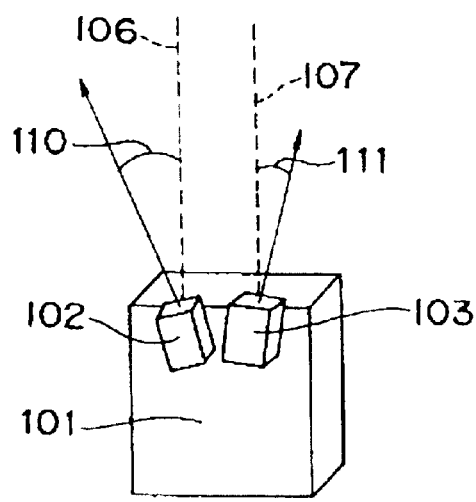
FIG. 11 shows a schematic perspective view of the semiconductor laser device according to the present invention.
Figure 11:
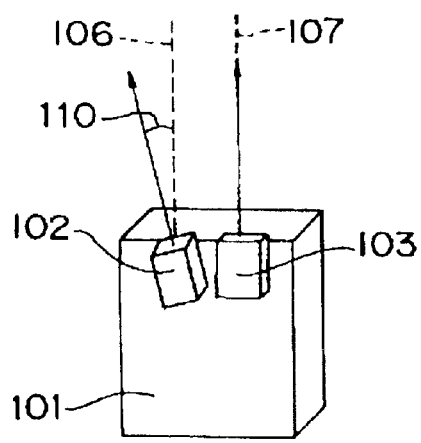
Figure 11:
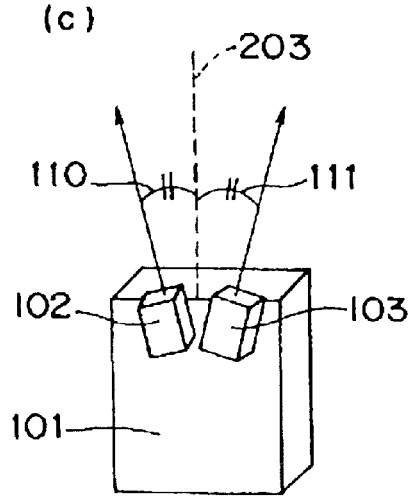

In such a case, as shown in FIG. 11(b), there is a method to adjust an emitted light axis of only one LD chip so as to stay in a prescribed angular range. For example, die-bonding is conducted after an emitted light axis of a shorter wavelength LD chip, accuracy of which is required in an optical pickup, is adjusted so as to stay in a prescribed angular range. Alternatively, as shown in FIG. 11(c), in a case where the emitted light axes of both LD chips are not parallel each other, the semiconductor laser element can be die-bonded so that an angle formed by one emitted light axis and a reference direction relative to the stem and an angle formed by the other emitted light axis and the reference direction become identical to prevent either one of emitted light axes from falling outside a required angle range.

Thereby, an emitted light axis of one of LD chips can be prevented from being far away from an angular range required for a lens used in an optical pickup, leading to prevention of deterioration in properties of an optical pickup.

Figure 13:
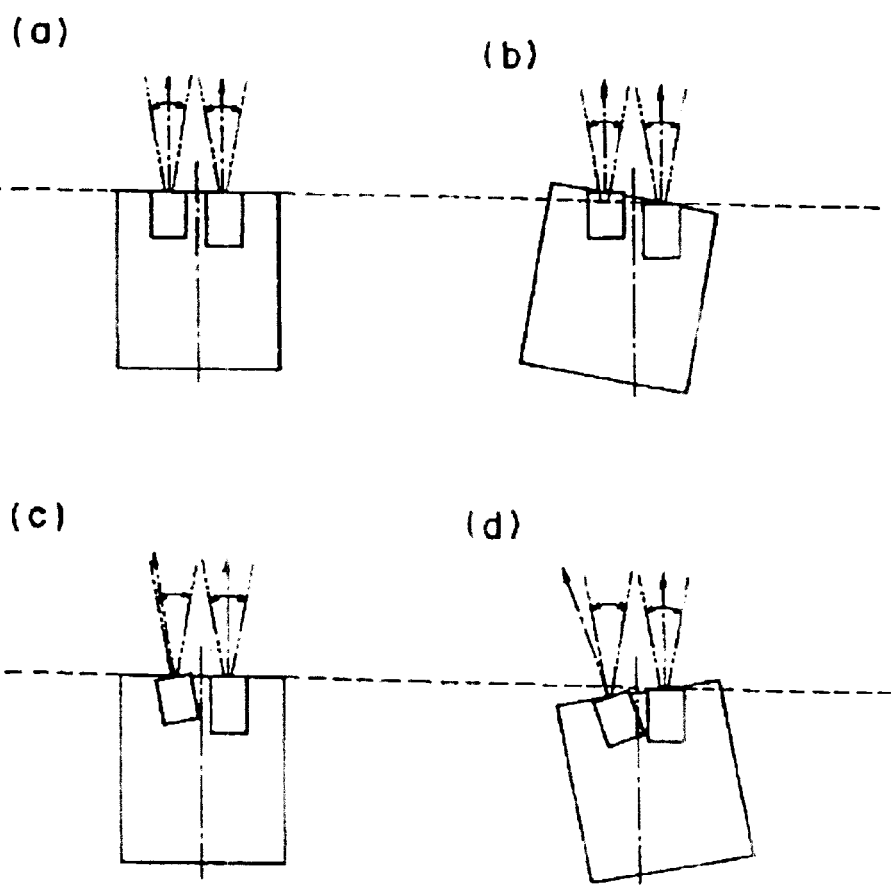
FIG. 13 shows examples for correction of the directions of emitted light axes according to the conventional method for manufacturing a semiconductor laser device.

In a case where an emitted light axis of one LD chip is consistent with a predetermined direction based on a sub-mount, but an emitted light axis of the other LD chip is inconsistent with the predetermined direction, for example, as shown in FIG. 12(c), according to the aforementioned conventional method for manufacturing a semiconductor laser device, as shown in FIG. 13(c), even when the emitted light axis of one LD chip is consistent with a predetermined direction based on the stem, and the emitted light axis of the other LD chip stays in the prescribed angular range, the desired properties cannot be fully exerted.

Figure 14:
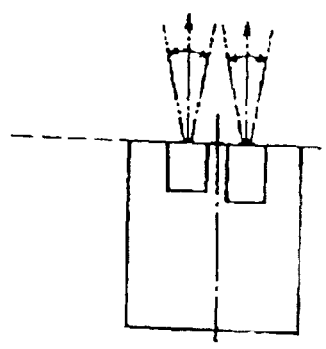
FIG. 14 shows examples for correction of the directions of emitted light axes according to the present method for manufacturing a semiconductor laser device.
Figure 14:
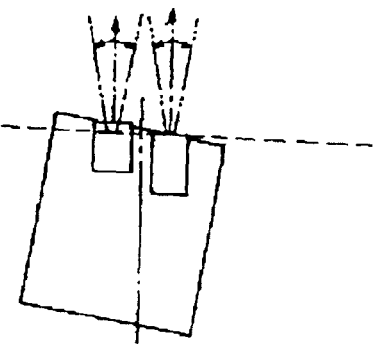
Figure 14:
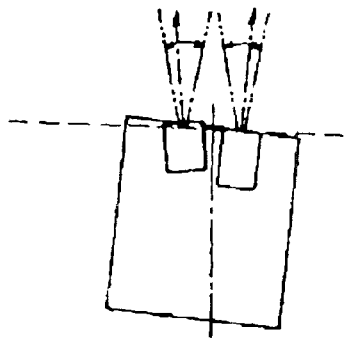
Figure 14:
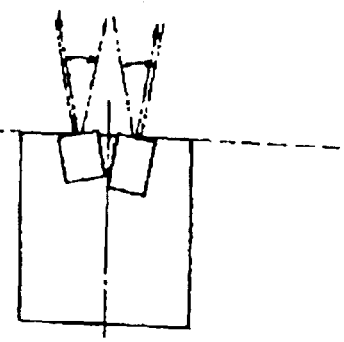

On the other hand, according to the present method for manufacturing a semiconductor laser device, since emitted light axes of two LD chips are recognized to correct the position of the semiconductor laser element, it becomes possible that both emitted light axes of two LD chips stay in prescribed angular ranges, as shown in FIG. 14(c).

In addition, as shown in FIG. 12(d), in a case where the emitted light axes of both LD chips are inconsistent with the predetermined direction based on the sub-mount, according to the aforementioned conventional method for manufacturing a semiconductor laser device, the emitted light axis of at lease one LD chip falls outside a prescribed angular range based on the stem, and such a semiconductor laser element is regarded as a defective product.

On the other hand, according to the present method for manufacturing a semiconductor laser device, even in the above case, it becomes possible that the emitted light axes of both LD chips stay in the prescribed angular ranges.

Thus, even when a semiconductor laser device is regarded as a defective product in the conventional method for manufacturing a semiconductor laser device, the present method can make such a semiconductor laser element satisfy a specification, leading to reduction in a percentage of defective products.

D. Manufacturing of an Optical Pickup

Figures 1, 2:
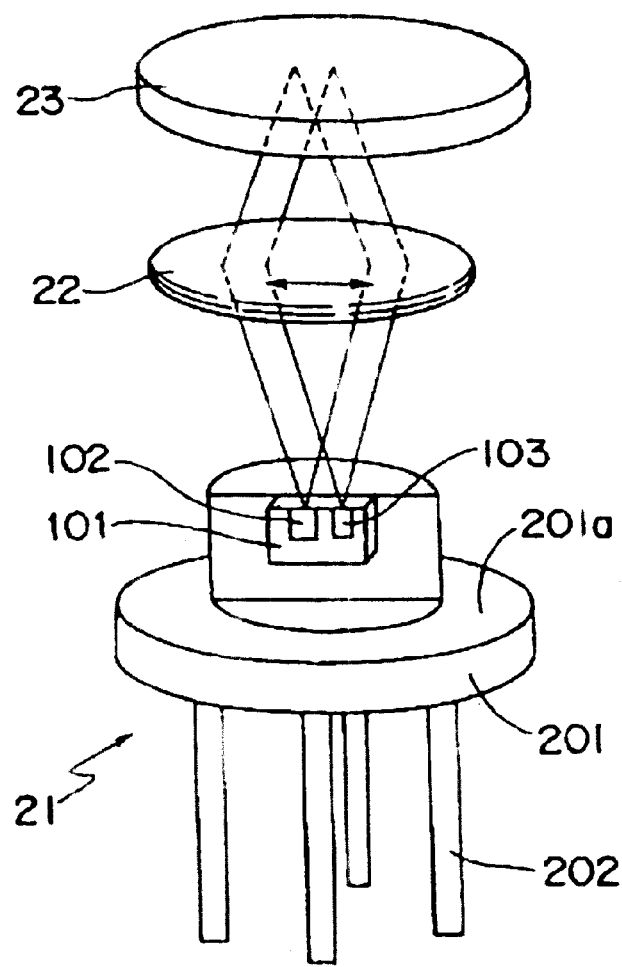
FIG. 1 shows a schematic perspective view of a semiconductor laser element in which one red LD chip and one infrared LD chip are mounted on one sub-mount.
FIG. 2 shows a schematic perspective view of an optical pickup.
Figure 3:
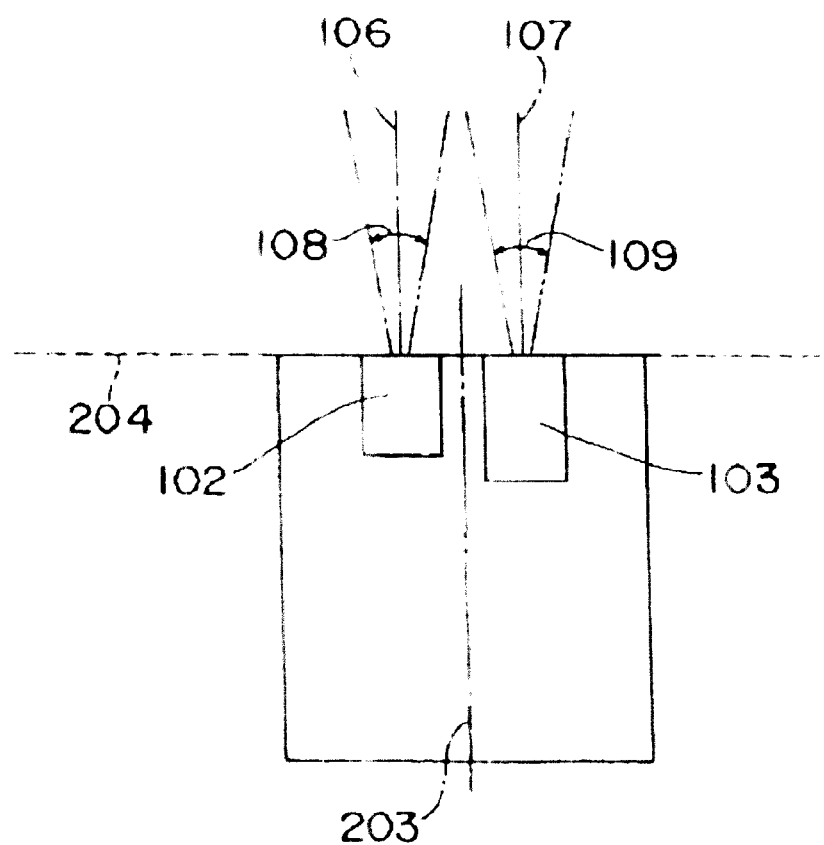
FIG. 3 shows an illustration indicating axes of lights emitted from LD chips in a semiconductor laser element.
Figure 4:
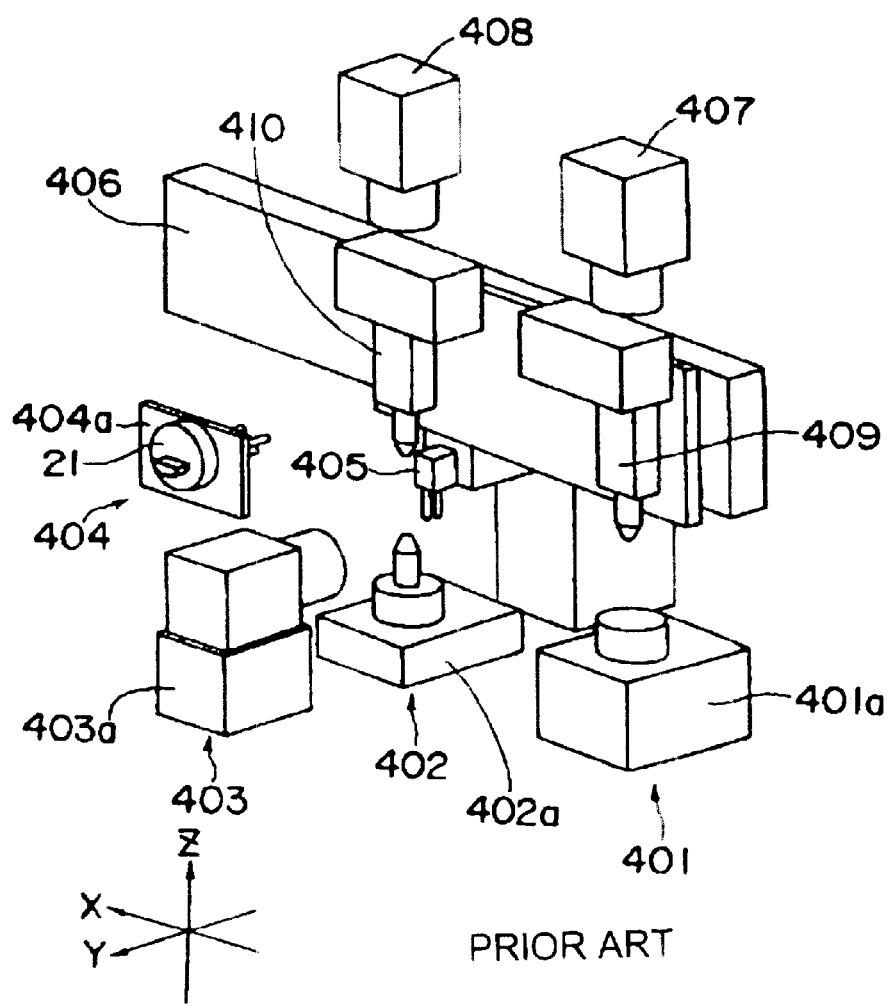
FIG. 4 shows a schematic perspective view of the conventional apparatus for manufacturing a semiconductor laser device.

Using the conventional technique, an optical pickup (see FIG. 2) comprising a semiconductor laser device manufactured by using the present apparatus and the present method, a lens, and others can be produced at a high yield.

Effects of the Invention

When a sub-mount with a plurality of LD chips die-bonded thereon is die-bonded on a stem at a prescribed angle relative to the stem, by recognizing emitted light axes of respective LD chips, and by die-bonding the sub-mount on the stem so that the emitted light axes of the LD chips lie at an optimized angle, a high-precise semiconductor laser device can be manufactured. Further, by using a semiconductor laser device manufactured by the present method, high-precise optical pickups can be produced at a high yield. In addition, when an emitted light axis of either one LD chip or emitted light axes of both LD chips is not within a specification, since die-bonding is discontinued at this point in time, a yield in a subsequent process can be improved.

What we claimed are:

1. An apparatus for manufacturing a semiconductor laser device, comprising:
    an element sheet part for supplying a semiconductor laser element in which one or more semiconductor laser chips are die-bonded on one sub-mount;
    an intermediate stage part for correcting a position of the supplied semiconductor laser element;
    an emitted light axis recognizing part for recognizing an emission point and an emitted light axis of the semiconductor laser element set on the intermediate stage part;
    a die-bonding part for die-bonding on a stem of the semiconductor laser element, a position of which has been corrected; and
    a transferring movable part for transferring the semiconductor laser element to any parts,
    wherein said transferring movable part comprises:
        at least two collet parts; and
        one or more contacting parts having a contact probe pair for contacting with the semiconductor laser chips and with corresponding electrode patterns on the sub-mount in order to energize the semiconductor laser chips in the semiconductor laser element to emit light.

2. The apparatus for manufacturing a semiconductor laser device according to claim 1, which further comprises a camera for recognizing a shape of the semiconductor laser element at the element sheet part and at the intermediate stage part.

3. The apparatus for manufacturing a semiconductor laser device according to claim 1, which further comprises actuators for driving the at least two collet parts and the one or more contacting parts up and down, and said actuators are provided separately outside the transferring movable part.

4. The apparatus for manufacturing a semiconductor laser device according to claim 1, wherein the contacting part is provided with one or more contact probe pairs disposed to correspond to positions of one or more semiconductor laser chips in the semiconductor laser element set on the intermediate stage part and the positions of the corresponding electrode patterns on the sub-mount.

5. The apparatus for manufacturing a semiconductor laser device according to claim 1, wherein the contact part is provided with more than one contact probe pairs, which are disposed at respective positions shifted by a prescribed distance from each position of the plurality of semiconductor laser chips in the semiconductor laser element set on the intermediate stage part and from each corresponding positions of the electrodes patterns on the sub-mount in a direction orthogonal to a light emitting direction while maintaining relative positional relationships between electrode patterns on the sub-mount as a pair.

6. The apparatus for manufacturing a semiconductor laser device according to claim 1, wherein the contacting part is provided with more than one contact probe pair disposed at respective positions shifted by a distance from each position of the plurality of semiconductor laser chips in the semiconductor laser element set on the intermediate stage part and from each corresponding position of the electrode patterns on the sub-mount in a direction parallel to the direction of the light emission while maintaining relative positional relationships between electrode patterns on the sub-mount as a pair, and heights of the contact probe pairs are such that the height of the contact probe pair in front of a light emitting direction is set to be greater than the height of another contact probe pair.

7. The apparatus for manufacturing a semiconductor laser device according to claim 1, wherein the contacting part is placed outside the collet part nearest to the die-bonding part.

8. The apparatus for manufacturing a semiconductor laser device according to claim 1, wherein the contacting part is placed between one collet part and another collet part.

9. The apparatus for manufacturing a semiconductor laser device according to claim 8, wherein the contacting part is disposed by the collet part nearest to the die-bonding part.

10. A method for manufacturing a semiconductor laser device, comprising:
    taking up a semiconductor laser element, in which one or more semiconductor laser chips are die-bonded on one sub-mount, from an element sheet part, and transferring said semiconductor laser element to an intermediate stage part by moving a collet part;
    correcting a position of said semiconductor laser element on the intermediate stage part by recognizing its shape;
    emitting light from the one or more semiconductor laser chips on the intermediate stage part by moving the collet part;
    conducting recognition of emission points and emitted light axes of the one or more semiconductor laser chips;
    correcting a position of the semiconductor laser element based on the results of the recognition of emission points and emitted light axes;
    transferring to a die-bonding part of the semiconductor laser element, a position of which has been corrected; and
    die-bonding the semiconductor laser element on a stem.

11. The method for manufacturing a semiconductor laser device according to claim 10, wherein
    the shape-recognition of the semiconductor laser element is conducted with a camera provided above the transferring movable part during a motion of moving the transferring movable part.

12. The method for manufacturing a semiconductor laser device according to claim 10, using an apparatus for manufacturing a semiconductor laser device comprising a contacting part which is provided with one or more contact probe pairs depending on the position of one or more semiconductor laser chips in the semiconductor laser element set on the intermediate stage part and the positions of the corresponding electrode patterns on the sub-mount and comprising:
    simultaneously emitting light from one or more of a plurality of semiconductor laser chips in a semiconductor laser element;
    recognizing emitted light axes of each of the plurality of semiconductor laser chips with an emitted light axis recognizing part; and
    correcting a position of each emitted light axis so as to stay in a prescribed angular range based on the recognition results.

13. The method for manufacturing a semiconductor laser device according to claim 10, using an apparatus for manufacturing a semiconductor laser device comprising a mechanism which is provided with more than one contact probe pairs depending on the position of one or more semiconductor laser chips in the semiconductor laser element set on the intermediate stage part and the positions of the corresponding electrode patterns on the sub-mount and is configured to transmit the emitted light axis recognizing part to a predetermined position of the semiconductor laser chip and comprising:

emitting light from one of a plurality of the semiconductor laser chips in a semiconductor laser element;

recognizing emitted light axes of the one of the plurality of semiconductor laser chips with an emitted light axis recognizing part;

moving a contacting part by a prescribed distance;

emitting a next one of the plurality of semiconductor laser chips;

recognizing an emitted light axis of the next one of the plurality of semiconductor laser chips with the emitted light axis recognizing part;

recognizing successively a prescribed number of emitted light axes of the remaining semiconductor laser chips with the emitted light axis recognizing part; and correcting a position of each emitted light axis so as to stay in respective prescribed angular ranges based on the recognition results.

14. The method for manufacturing a semiconductor laser device according to claim 10, using an apparatus for manufacturing a semiconductor laser device comprising an element sheet part for supplying a semiconductor laser element in which one or more semiconductor laser chips are die-bonded on one sub-mount; an intermediate stage part for correcting a position of the supplied semiconductor laser element; an emitted light axis recognizing part for recognizing an emission point and an emitted light axis of the semiconductor laser element set on the intermediate stage part; a die-bonding part for die-bonding on a stem of the semiconductor laser element, a position of which has been corrected; and a transferring movable part for transferring the semiconductor laser element to any parts which comprises at least two collet parts; and one or more contacting parts having a contact probe pair for contacting with the semiconductor laser chips and with corresponding electrode patterns on the sub-mount in order to energize the semiconductor laser chips in the semiconductor laser element to emit light, wherein the contact part is provided with more than one contact probe pairs, which are disposed at respective positions shifted by a prescribed distance from each position of the plurality of semiconductor laser chips in the semiconductor laser element set on the intermediate stage part and from each corresponding positions of the electrode patterns on the sub-mount in a direction orthogonal to a light emitting direction, while maintaining relative positional relationships between electrode patterns on the sub-mount as a pair, the method comprising:

emitting light from one or more of a plurality of semiconductor laser chips in a semiconductor laser element;

recognizing emitted light axes of the one or more of the plurality of semiconductor laser chips with an emitted light axis recognizing part;

moving a contacting part by a prescribed distance;

emitting light from a next one or more of the plurality of semiconductor laser chips;

recognizing emitted light axes of the next one or more of the plurality of semiconductor laser chips with the emitted light axis recognizing part;

recognizing successively a prescribed number of emitted light axes of the remaining semiconductor laser chips with the emitted light axis recognizing part; and correcting a position of each emitted light axis so that the prescribed number of emitted light axes stay in respective prescribed angular ranges based on the recognition results.

15. The method for manufacturing a semiconductor laser device according to claim 14, using an apparatus for manufacturing a semiconductor laser device comprising an element sheet part for supplying a semiconductor laser element in which one or more semiconductor laser chips are die-bonded on one sub-mount; an intermediate stage part for correcting a position of the supplied semiconductor laser element; an emitted light axis recognizing part for recognizing an emission point and an emitted light axis of the semiconductor laser element set on the intermediate stage part; a die-bonding part for die-bonding on a stem of the semiconductor laser element, a position of which has been corrected; and a transferring movable part for transferring the semiconductor laser element to any parts which comprises at least two collet parts; and one or more contacting parts having a contact probe pair for contacting with the semiconductor laser chips and with corresponding electrode patterns on the sub-mount in order to energize the semiconductor laser chips in the semiconductor laser element to emit light, wherein the contact part is provided with more than one contact probe pairs, which are disposed at respective positions shifted by a prescribed distance from each position of the plurality of semiconductor laser chips in the semiconductor laser element set on the intermediate stage part and from each corresponding positions of the electrode patterns on the sub-mount in a direction orthogonal to a light emitting direction, while maintaining relative positional relationships between electrode patterns on the sub-mount as a pair, the method comprising:

emitting light from one or more of a plurality of semiconductor laser chips in a semiconductor laser element;

recognizing emitted light axes of one or more of the plurality of semiconductor laser chips with an emitted light axis recognizing part;

moving a contacting part and the emitting light axis recognizing part by prescribed distances;

emitting light from a next one or more of the plurality of semiconductor laser chips;

recognizing emitted light axes of the next one or more of the plurality of semiconductor laser chips with the emitted light axis recognizing part;

recognizing successively a prescribed number of emitted light axes of the remaining semiconductor laser chips with the emitted light axis recognizing part; and correcting a position of each emitted light axis so that the prescribed number of emitted light axes stay in respective prescribed angular ranges based on the recognition results.

16. The method for manufacturing a semiconductor laser device according to claim 14, using an apparatus for manufacturing a semiconductor laser device comprising an element sheet part for supplying a semiconductor laser element in which one or more semiconductor laser chips are die-bonded on one sub-mount; an intermediate stage part for correcting a position of the supplied semiconductor laser element; an emitted light axis recognizing part for recognizing an emission point and an emitted light axis of the semiconductor laser element set on the intermediate stage part; a die-bonding part for die-bonding on a stem of the semiconductor laser element, a position of which has been corrected; and a transferring movable part for transferring the semiconductor laser element to any parts which comprises at least two collet parts; and one or more contacting parts having a contact probe pair for contacting with the semiconductor laser chips and with corresponding electrode patterns on the sub-mount in order to energize the semiconductor laser chips in the semiconductor laser element to emit light, wherein the contact part is provided with more than one contact probe pairs, which are disposed at respective positions shifted by a prescribed distance from each position of the plurality of semiconductor laser chips in the semiconductor laser element set on the intermediate stage part and from each corresponding positions of the electrode patterns on the sub-mount in a direction orthogonal to a light emitting direction while maintaining relative positional relationships between electrode patterns on the sub-mount as a pair, the method comprising:

emitting light from one or more of a plurality of semiconductor laser chips in a semiconductor laser element;

recognizing emitted light axes of one or more of the plurality of semiconductor laser chips with an emitted light axis recognizing part;

moving a contacting part and the intermediate stage part by prescribed distances;

emitting light from a next one or more of the plurality of semiconductor laser chips;

recognizing emitted light axes of the next one or more of the plurality of semiconductor laser chips with the emitted light axis recognizing part;

recognizing successively a prescribed number of emitted light axes of the remaining semiconductor laser chips with the emitted light axis recognizing part; and correcting a position of each emitted light axis so that the prescribed number of emitted light axes stay in respective prescribed angular ranges based on the recognition results.

17. The method for manufacturing a semiconductor laser device according to claim 10, using an apparatus for manufacturing a semiconductor laser device comprising an element sheet part for supplying a semiconductor laser element in which one or more semiconductor laser chips are die-bonded on one sub-mount; an intermediate stage part for correcting a position of the supplied semiconductor laser element; an emitted light axis recognizing part for recognizing an emission point and an emitted light axis of the semiconductor laser element set on the intermediate stage part; a die-bonding part for die-bonding on a stem the semiconductor laser element, a position of which has been corrected; and a transferring movable part for transferring the semiconductor laser element to any parts which comprises at least two collet parts; and one or more contacting parts having a contact probe pair for contacting with the semiconductor laser chips and with corresponding electrode patterns on the sub-mount in order to energize the semiconductor laser chips in the semiconductor laser element to emit light, wherein the contacting part is provided with a plurality of contact probe pairs disposed at respective positions shifted by a distance from each position of the plurality of semiconductor laser chips in the semiconductor laser element set on the intermediate stage part and from each corresponding position of the electrode patterns on the sub-mount in a direction parallel to the direction of the light emission while maintaining relative positional relationships between electrode patterns on the sub-mount as a pair, and heights of the contact probe pairs are such that the height of the contact probe pair in front of a light emitting direction is set to be greater than the height of another contact probe pair, the method comprising:

emitting light from one or more of a plurality of semiconductor laser chips in a semiconductor laser element;

recognizing emitted light axes of the one or more of the plurality of semiconductor laser chips with an emitted light axis recognizing part;

moving a contacting part by a prescribed distance;

emitting light from a next one or more of the plurality of semiconductor laser chips;

recognizing emitted light axes of the next one or more of the plurality of semiconductor laser chips with the emitted light axis recognizing part;

recognizing successively a prescribed number of emitted light axes of the remaining semiconductor laser chips with the emitted light axis recognizing part; and correcting a position of each emitted light axis so that the prescribed number of emitted light axes stay in respective prescribed angular ranges based on the recognition results.

18. The method for manufacturing a semiconductor laser device according to claim 17, using an apparatus for manufacturing a semiconductor laser device comprising an element sheet part for supplying a semiconductor laser element in which one or more semiconductor laser chips are die-bonded on one sub-mount; an intermediate stage part for correcting a position of the supplied semiconductor laser element; an emitted light axis recognizing part for recognizing an emission point and an emitted light axis of the semiconductor laser element set on the intermediate stage part; a die-bonding part for die-bonding on a stem the semiconductor laser element, a position of which has been corrected; and a transferring movable part for transferring the semiconductor laser element to any parts which comprises at least two collet parts; and one or more contacting parts having a contact probe pair for contacting with the semiconductor laser chips and with corresponding electrode patterns on the sub-mount in order to energize the semiconductor laser chips in the semiconductor laser element to emit light, wherein the contacting part is provided with a plurality of contact probe pairs disposed at respective positions shifted by a distance from each position of the plurality of semiconductor laser chips in the semiconductor laser element set on the intermediate stage part and from each corresponding position of the electrode patterns on the sub-mount in a direction parallel to the direction of the light emission while maintaining relative positional relationships between electrode patterns on the sub-mount as a pair, and heights of the contact probe pairs are such that the height of the contact probe pair in front of a light emitting direction is set to be greater than the height of another contact probe pair, the method comprising:

emitting light from one or more of a plurality of semiconductor laser chips in a semiconductor laser element;

recognizing emitted light axes of one or more of the plurality of semiconductor laser chips with an emitted light axis recognizing part;

moving a contacting part and the emitting light axis recognizing part by prescribed distances;

emitting light from a next one or more of the plurality of semiconductor laser chips;

recognizing emitted light axes of the next one or more of the plurality of semiconductor laser chips with the emitted light axis recognizing part;

recognizing successively a prescribed number of emitted light axes of the remaining semiconductor laser chips with the emitted light axis recognizing part; and correcting a position of each emitted light axis so that the prescribed number of emitted light axes stay in respective prescribed angular ranges based on the recognition results.

19. The method for manufacturing a semiconductor laser device according to claim 17, using an apparatus for manufacturing a semiconductor laser device comprising an element sheet part for supplying a semiconductor laser element in which one or more semiconductor laser chips are die-bonded on one sub-mount; an intermediate stage part for correcting a position of the supplied semiconductor laser element; an emitted light axis recognizing part for recognizing an emission point and an emitted light axis of the semiconductor laser element set on the intermediate stage part; a die-bonding part for die-bonding on a stem the semiconductor laser element, a position of which has been corrected; and a transferring movable part for transferring the semiconductor laser element to any parts which comprises at least two collet parts; and one or more contacting parts having a contact probe pair for contacting with the semiconductor laser chips and with corresponding electrode patterns on the sub-mount in order to energize the semiconductor laser chips in the semiconductor laser element to emit light, wherein the contacting part is provided with a plurality of contact probe pairs disposed at respective positions shifted by a distance from each position of the plurality of semiconductor laser chips in the semiconductor laser element set on the intermediate stage part and from each corresponding position of the electrode patterns on the sub-mount in a direction parallel to the direction of the light emission while maintaining relative positional relationships between electrode patterns on the sub-mount as a pair, and heights of the contact probe pairs are such that the height of the contact probe pair in front of a light emitting direction is set to be greater than the height of another contact probe pair, the method comprising:

emitting light from one or more of a plurality of semiconductor laser chips in a semiconductor laser element;

recognizing emitted light axes of one or more of the plurality of semiconductor laser chips with an emitted light axis recognizing part;

moving a contacting part and the intermediate stage part by prescribed distances;

emitting light from a next one or more of the plurality of semiconductor laser chips;

recognizing emitted light axes of the next one or more of the plurality of semiconductor laser chips with the emitted light axis recognizing part;

recognizing successively a prescribed number of emitted light axes of the remaining semiconductor laser chips with the emitted light axis recognizing part; and correcting a position of each emitted light axis so that the prescribed number of emitted light axes stay in respective prescribed angular ranges based on the recognition results.

20. The method for manufacturing a semiconductor laser device according to claim 12, 13, 14, or 17, further comprising determining that a semiconductor laser element is a defective product when emitted light axes of semiconductor laser chips in the semiconductor laser element and angular differences between the emitted light axes fall outside prescribed angular ranges before the die-bonding has taken place.

21. The method for manufacturing a semiconductor laser device according to claim 12, 13, 14, or 17, wherein a semiconductor laser element is die-bonded on a stem only when the emitted light axes of semiconductor laser chips in the semiconductor laser element stay in their respective prescribed ranges.

22. The method for manufacturing a semiconductor laser device according to claim 12, 13, 14, or 17, further comprising feedback processing that operates when the emitted light axes of semiconductor laser chips in the semiconductor laser element and relative angles of the emitted light axes to the sub-mount fall outside prescribed angular ranges.

23. The method for manufacturing a semiconductor laser device according to claim 12, 13, 14, or 17, further comprising feedback processing that operates when the emitted light axes of the semiconductor laser chips in the semiconductor laser element and angular differences between the emitted light axes fall outside prescribed angular ranges.

* * * * *